(12) United States Patent
Li et al.

(10) Patent No.: US 11,876,154 B2
(45) Date of Patent: Jan. 16, 2024

(54) LIGHT EMITTING DIODE DEVICE AND METHOD FOR MANUFACTURING THE SAME

(71) Applicant: XIAMEN SAN'AN OPTOELECTRONICS CO., LTD., Xiamen (CN)

(72) Inventors: Mingyang Li, Xiamen (CN); Guanzhou Liu, Tianjin (CN); Jingfeng Bi, Tianjin (CN); Senlin Li, Tianjin (CN); Minghui Song, Tianjin (CN); Wenjun Chen, Tianjin (CN)

(73) Assignee: Xiamen San'An Optoelectronics Co., Ltd., Xiamen (CN)

( * ) Notice: Subject to any disclaimer, the term of this patent is extended or adjusted under 35 U.S.C. 154(b) by 633 days.

(21) Appl. No.: 16/796,375

(22) Filed: Feb. 20, 2020

(65) Prior Publication Data

US 2020/0194634 A1    Jun. 18, 2020

Related U.S. Application Data

(63) Continuation-in-part of application No. PCT/CN2018/081676, filed on Apr. 3, 2018.

(30) Foreign Application Priority Data

Aug. 21, 2017    (CN) .......................... 201710718131.7

(51) Int. Cl.
*H01L 33/50*        (2010.01)
*H01L 33/62*        (2010.01)

(52) U.S. Cl.
CPC .......... *H01L 33/504* (2013.01); *H01L 33/508* (2013.01); *H01L 33/62* (2013.01);
(Continued)

(58) Field of Classification Search
CPC ..... H01L 33/50; H01L 33/504; H01L 33/508; H01L 33/08; H01L 33/42–48;
(Continued)

(56) References Cited

U.S. PATENT DOCUMENTS

2008/0251799 A1* 10/2008 Ikezawa .............. H01L 25/0756
257/89
2012/0313119 A1* 12/2012 Chang ................. H01L 25/0756
257/E33.072

(Continued)

FOREIGN PATENT DOCUMENTS

CN    101740557 A    6/2010
CN    104282810 A    1/2015
(Continued)

OTHER PUBLICATIONS

Search Report issued to PCT application No. PCT/CN2018/081676 by the CNIPA dated Jul. 11, 2018.

*Primary Examiner* — Latanya N Crawford Eason
(74) *Attorney, Agent, or Firm* — Thomas | Horstemeyer, LLP

(57) ABSTRACT

A light-emitting diode (LED) device includes a first epitaxial layered structure having an upper surface having different first and second regions, a second epitaxial layered structure spaced-apart disposed on the first epitaxial layered structure, a light conversion layer formed on the first region, a bonding unit disposed on the light conversion layer, the bonding unit and the light conversion layer interconnecting the first and second epitaxial layered structures, and an electrically conductive structure formed on the second region and electrically connects the first and second epitaxial layered structures. A method for manufacturing the LED device is also disclosed.

19 Claims, 5 Drawing Sheets

(52) U.S. Cl.
CPC ............... *H01L 2933/0041* (2013.01); *H01L 2933/0066* (2013.01)

(58) Field of Classification Search
CPC ............ H01L 51/5262; H01L 25/0756; H01L 33/501; H01L 33/502; H01L 33/505; H01L 33/507; H01L 2933/0041; H01L 33/62; H01L 33/642; H01L 2933/0066
See application file for complete search history.

(56) References Cited

U.S. PATENT DOCUMENTS

| | | | |
|---|---|---|---|
| 2014/0252382 A1* | 9/2014 | Hashimoto | H01L 33/60 438/27 |
| 2015/0001561 A1* | 1/2015 | Katsuno | H01L 33/382 257/90 |
| 2017/0288093 A1* | 10/2017 | Cha | H01L 33/58 |

FOREIGN PATENT DOCUMENTS

| | | |
|---|---|---|
| CN | 104733487 A | 6/2015 |
| CN | 107611232 A | 1/2018 |

* cited by examiner

LIGHT EMITTING DIODE DEVICE AND METHOD FOR MANUFACTURING THE SAME

CROSS-REFERENCE TO RELATED APPLICATIONS

This application is a bypass continuation-in-part (CIP) application of PCT International Application No. PCT/CN2018/081676, filed on Apr. 3, 2018, which claims priority of Chinese Invention Patent Application No. 201710718131.7, filed on Aug. 21, 2017. The entire content of each of the International and Chinese patent applications is incorporated herein by reference.

FIELD

This disclosure relates to a light-emitting diode device and a method for manufacturing the same.

BACKGROUND

A light-emitting diode (LED) is a safe and environmentally friendly fourth generation light source which has advantageous characteristics, such as energy-saving, long service life, low power consumption, etc. Therefore, LED devices have been widely used in various applications such as signal lights, monitor displays, decorations, backlight sources, and illuminations. With the advancement of LED industry, the efficiency of LED devices has been constantly improved, and the manufacturing cost thereof has been reduced.

In recent years, double- or multi-junction LED devices have been developed to improve a light extraction efficiency thereof. Specifically, during epitaxial growth, two quantum well structures are connected by a tunnel structure to form a double-junction LED device, such that the light extraction efficiency thereof may be greatly improved as compared to that of an LED device having only one quantum well structure under the same current. In addition, an LED component of the LED device may be installed invertedly so that an epitaxial structure of the LED component is in direct contact with a thermally conductive substrate to enhance heat dissipation, and a growth substrate thereof is faced upwardly and is light-transmissive to allow light emitted from the epitaxial structure to pass therethrough, thereby increasing the luminance of the LED device.

Despite the aforesaid development of LED device, there is still a need for further improvement of the light extraction efficiency of the LED device.

SUMMARY

Therefore, an object of the disclosure is to provide a light-emitting diode (LED) device and a method for manufacturing the same which can alleviate at least one of the drawbacks of the prior art.

According to the disclosure, the light-emitting diode device includes a first epitaxial layered structure, a second epitaxial layered structure, a light conversion layer, a bonding unit, and an electrically conductive structure. The first epitaxial layered structure emits light of a first wavelength range, and has an upper surface having a first region and a second region different from the first region. The second epitaxial layered structure emits light of a second wavelength range different from the first wavelength range, and is spaced-apart disposed on the upper surface of the first epitaxial layered structure. The light conversion layer is formed on the first region of the upper surface of the first epitaxial layered structure and is configured to be excited by light of the first wavelength range emitted from the first epitaxial layered structure to emit light of a third wavelength range different from the first wavelength range. The bonding unit is disposed on the light conversion layer and is configured to allow light of the third wavelength range emitted from the light conversion layer to pass therethrough. The bonding unit and the light conversion layer interconnect the first and second epitaxial layered structures. The electrically conductive structure is formed on the second region of the upper surface of the first epitaxial layered structure and electrically connects the first epitaxial layered structure to the second epitaxial layered structure.

According to the disclosure, the method for manufacturing an LED device includes the steps of:
a) providing a first epitaxial layered structure which emits light of a first wavelength range and includes an upper surface having a first region and a second region different from the first region;
b) providing a second epitaxial layered structure which emits light of a second wavelength range different from the first wavelength range;
c) forming a light conversion layer on the first region of the upper surface of the first epitaxial layered structure, the light conversion layer is configured to be excited by light of the first wavelength range emitted from the first epitaxial layered structure to emit light of a third wavelength range different from the first wavelength range;
d) forming an electrically conductive structure on the second region of the upper surface of the first epitaxial layered structure and between the first and second epitaxial layered structures so as to electrically connect the first and second epitaxial layered structures; and
e) forming a bonding unit between the second epitaxial layered structure and the light conversion layer, the bonding unit is configured to allow light of the third wavelength range emitted from the light conversion layer to pass therethrough.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
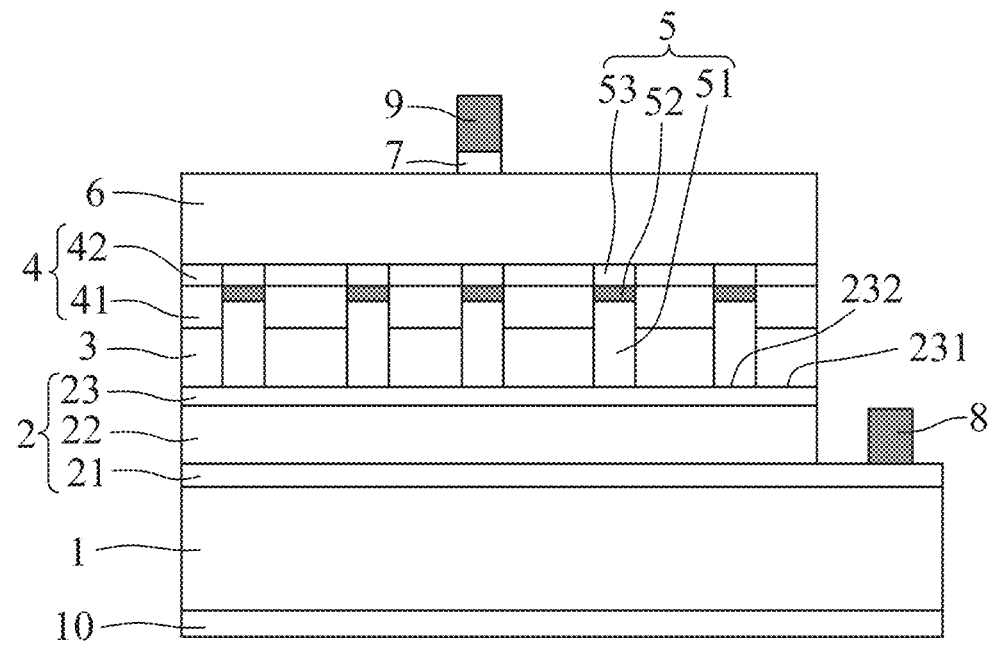
FIG. 1 is a schematic view illustrating a first embodiment of a light-emitting diode (LED) device according to the disclosure.

Before the disclosure is described in greater detail, it should be noted that where considered appropriate, reference numerals have been repeated among the figures to indicate corresponding or analogous elements, which may optionally have similar characteristics.

Further, in describing representative embodiments of the present disclosure, the method and/or process of the present disclosure may be presented as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present disclosure should not be limited to the performance of their steps in the order written, and one skilled in the art can readily appreciate that the sequences may be varied and still remain within the spirit and scope of the present disclosure.

Referring to FIG. 1, a first embodiment of a light-emitting diode (LED) device according to the disclosure includes a reflective mirror layer 10, a growth substrate 1, a first epitaxial layered structure 2, a second epitaxial layered structure 6, a light conversion layer 3, a bonding unit 4, and an electrically conductive structure 5. The growth substrate 1, which may be made from sapphire (i.e., $Al_2O_3$), is disposed on the reflective mirror layer 10.

The first epitaxial layered structure 2 is disposed on the growth substrate 1 and emits light of a first wavelength range. The first epitaxial layered structure 2 includes a first N-type semiconductor layer 21 disposed on the growth substrate 1, a first active layer 22 disposed on the first N-type semiconductor layer 21, and a first P-type semiconductor layer 23 disposed on the first active layer 22. The first P-type semiconductor layer 23 of the first epitaxial layered structure 2 has an upper surface on which a first region 231 and a second region 232 different from the first region 231 are defined.

The second epitaxial layered structure 6 emits light of a second wavelength range different from the first wavelength range, and is spaced-apart disposed on the upper surface of the first epitaxial layered structure 2. The second epitaxial layered structure 6 includes a second P-type semiconductor layer, a second active layer, and a second N-type semiconductor layer stacked on one another in a direction away from the first epitaxial layered structure 2 (not shown in the figures) In certain embodiments, the second epitaxial layered structure 6 has a band gap smaller than that of the first epitaxial layered structure 2. For example, the second epitaxial layered structure 6 may be made of a gallium indium phosphide (GaInP)-based material, and the first epitaxial layered structure 2 may be made of gallium nitride (GaN)-based material.

The light conversion layer 3 is formed on the first region 231 of the upper surface of the first P-type semiconductor layer 23 and is configured to be excited by light of the first wavelength range emitted from the first epitaxial layered structure 2 to emit light of a third wavelength range that is different from the first wavelength range. In certain embodiments, light of the third wavelength range emitted from the light conversion layer 3 has a peak wavelength that is substantially equal to a peak wavelength of light of the second wavelength range emitted from the second epitaxial layered structure 6.

As used herein, the term "substantially equal" refers to a value that is equal to, or slightly larger or smaller than the quantity it is compared to (e.g., differ by 10% or less), to the extent that it does not lead to unwanted alterations that are incompatible with the intended use.

As used herein, the term "peak wavelength" refers to the wavelength with the highest intensity within the given wavelength range of the emitted light.

The bonding unit 4 is disposed on the light conversion layer 3 and is configured to allow light of the third wavelength range emitted from the light conversion layer 3 to pass therethrough. The bonding unit 4 and the light conversion layer 3 interconnect the first and second epitaxial layered structures 2, 6. In this embodiment, the bonding unit 4 includes a first transparent optical layer 41 disposed on the light conversion layer 3 and a second transparent optical layer 42 disposed between the first transparent optical layer 41 and the second epitaxial layered structure 6.

The bonding unit 4 may be made of a band-pass material. In certain embodiments, the bonding unit 4 is configured to selectively allow light having a peak wavelength that is substantially equal to that of light of the second wavelength range emitted from the second epitaxial layered structure 6 to pass therethrough. That is, light emitted from the light conversion layer 3 may be partially filtered out by the bonding unit 4, where only light having a wavelength range similar to light of the second wavelength range emitted from the second epitaxial layered structure 6 is allowed to pass through. The bonding unit 4 may include a plurality of light-transmissive films stacked on one another. The number of the light-transmissive films and the materials thereof may be adjusted to control a wavelength range of light allowed to pass through the bonding unit 4.

The electrically conductive structure 5 is formed on the second region 232 of the upper surface of the first P-type semiconductor layer 23 of the first epitaxial layered structure 2, and electrically connects the first epitaxial layered structure 2 to the second epitaxial layered structure 6. In this embodiment, the electrically conductive structure 5 is formed immediately adjacent to the light conversion layer 3 and penetrates the bonding unit 4. The electrically conductive structure 5 includes a first ohmic contact layer 51 disposed on the first P-type semiconductor layer 23, a metallic layer 52 disposed on the first ohmic contact layer 51, and a second ohmic contact layer 53 disposed on the metallic layer 52. The electrically conductive structure 5 may further include a first space layer formed between the metallic layer 52 and the first ohmic contact layer 51, and a second space layer formed between the metallic layer 52 and the second ohmic contact layer 53 so as to prevent P-type and N-type dopants in the first and second ohmic contact layers 51, 53 from spreading into the metallic layer 52.

In this embodiment, light of the first wavelength range emitted from the first epitaxial layered structure 2 is blue light, and light of the second wavelength range emitted from the second epitaxial layered structure 6 is red light, and the light conversion layer 3 includes a red phosphor, which is capable of being excited by the blue light to emit red light (i.e., light of the third wavelength range). Therefore, the output light luminance of the LED device, which includes a sum of light of the second wavelength range and light of the third wavelength range, can be greatly enhanced.

Referring to FIGS. 2 to 7, an embodiment of a method for manufacturing the first embodiment of the LED device according to the disclosure includes the following steps:

a) providing a first epitaxial layered structure 2 which emits light of a first wavelength range and has an upper surface having a first region 231 and a second region 232 different from the first region 231;

b) providing a second epitaxial layered structure 6 which emits light of a second wavelength range different from the first wavelength range;

c) forming a light conversion layer 3 on the first region 231 of the upper surface of the first epitaxial layered structure 2, the light conversion layer 3 is configured to be excited by light of the first wavelength range emitted from the first epitaxial layered structure 2 to emit light of a third wavelength range different from the first wavelength range;

d) forming an electrically conductive structure 5 on the second region 232 of the upper surface of the first epitaxial layered structure 2 and between the first and second epitaxial layered structures 2, 6 so as to electrically connect the first and second epitaxial layered structures 2, 6; and e) forming a bonding unit 4 between the second epitaxial layered structure 6 and the light conversion layer 3, the bonding unit 4 is configured to allow light of the third wavelength range emitted from the light conversion layer 3 to pass therethrough.

Figure 2:
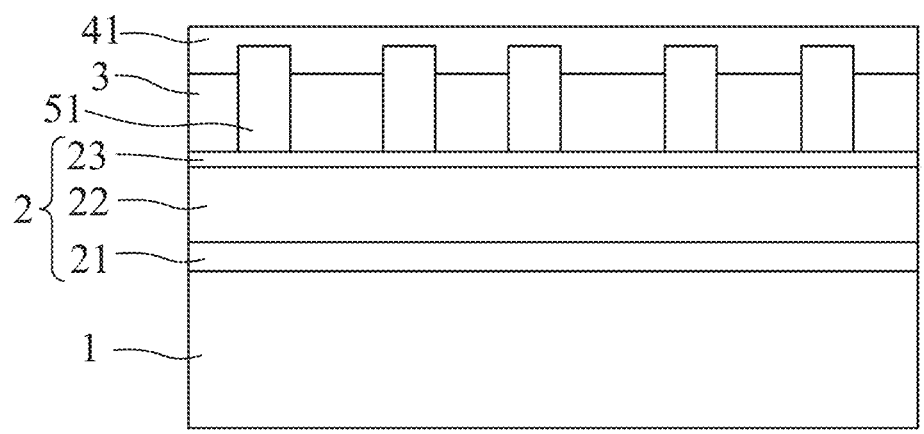
FIGS. 2 to 7 are schematic views illustrating consecutive steps of a method for manufacturing the first embodiment of the LED device according to the disclosure.

To be specific, in this embodiment, referring to FIG. 2, the first epitaxial layered structure 2 is formed on the growth substrate 1 and includes the first N-type semiconductor layer 21, the first active layer 22 and the first P-type semiconductor layer 23 that are sequentially disposed on the growth substrate 1 as described above. The first P-type semiconductor layer 23 has an upper surface on which the first region 231 and the second region 232 are defined. Afterwards, the red phosphor is coated on the first region 231 of the first P-type semiconductor layer 23 to form the light conversion layer 3, and the first ohmic contact layer 51 is formed on the second region 232 of the first P-type semiconductor layer 23 of the first epitaxial layered structure 2. The light conversion layer 3 may have a thickness ranging from 0.5 µm to 100 µm (e.g., 10 µm to 50 µm) so as to absorb light of the first wavelength range as much as possible. In certain embodiments, the light conversion layer 3 is configured to fully absorb light of the first wavelength range. Then, the first transparent optical layer 41 of the bonding unit 4 is formed on the light conversion layer 3. The first transparent optical layer 41 may include a plurality of light-transmissive films, such as silicon oxide ($SiO_2$) films and aluminum oxide ($Al_2O_3$) films alternately stacked on one another.

Figure 3:
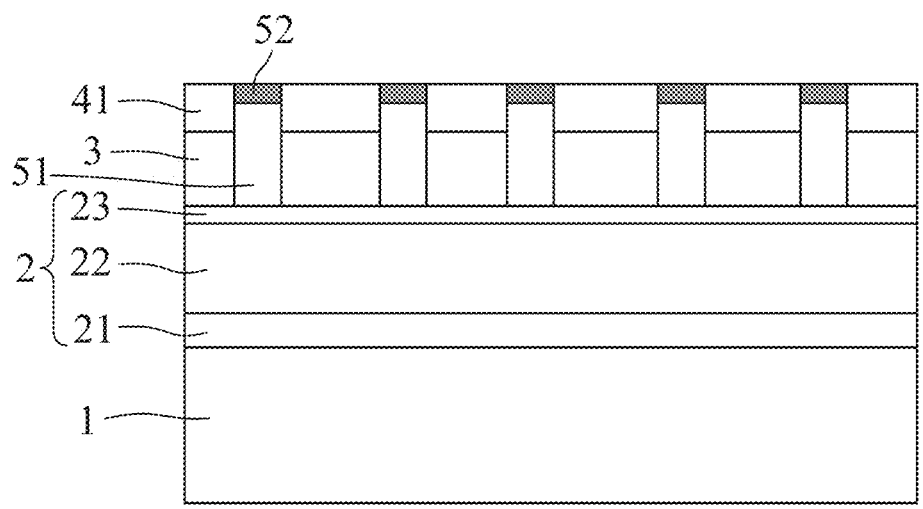

Referring to FIG. 3, a portion of the light conversion layer 3 and a portion of the first transparent optical layer 41 are etched to expose the first ohmic contact layer 51, and then the metallic layer 52 is formed on the exposed first ohmic contact layer 51. A thickness of the metallic layer 52 may be adjusted according to practical requirements as long as the metallic layer 52 is flushed with the first transparent optical layer 41.

Figure 4:
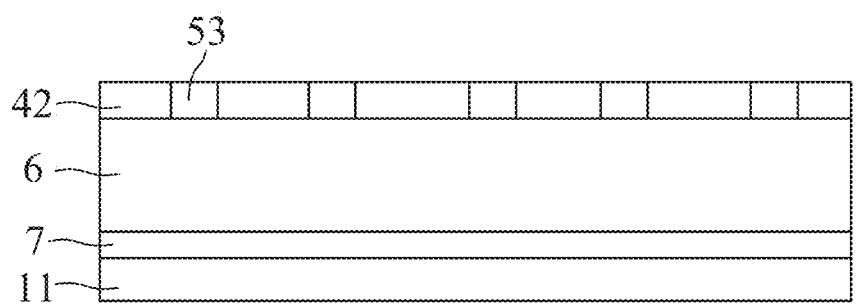

As shown in FIG. 4, the second epitaxial layered structure 6 which may be made of an aluminum gallium nitride phosphide (AlGaInP)-based material is disposed on a growth substrate 11 which may be made of a gallium arsenide (GaAs)-based material. A P-type ohmic contact layer 7 is formed between the second epitaxial layered structure 6 and the growth substrate 11. The second ohmic contact layer 53 is formed on the second epitaxial layered structure 6 opposite to the growth substrate 11 and then patterned using a photolithography process to remove a portion of the second ohmic contact layer 53 such that the remainder of the second ohmic contact layer 53 corresponds in position to the first ohmic contact layer 52 on the second region 232 of the first epitaxial layered structure 2. Thereafter, a plurality of light-transmissive films made of $SiO_2$ and $Al_2O_3$ are alternately stacked on one another to form the second transparent optical layer 42 on the second epitaxial layered structure 6 and the second ohmic contact layer 53.

Subsequently, a portion of the second transparent optical layer 42 is removed using the photolithography process to expose the second ohmic contact layer 53.

Figure 5:
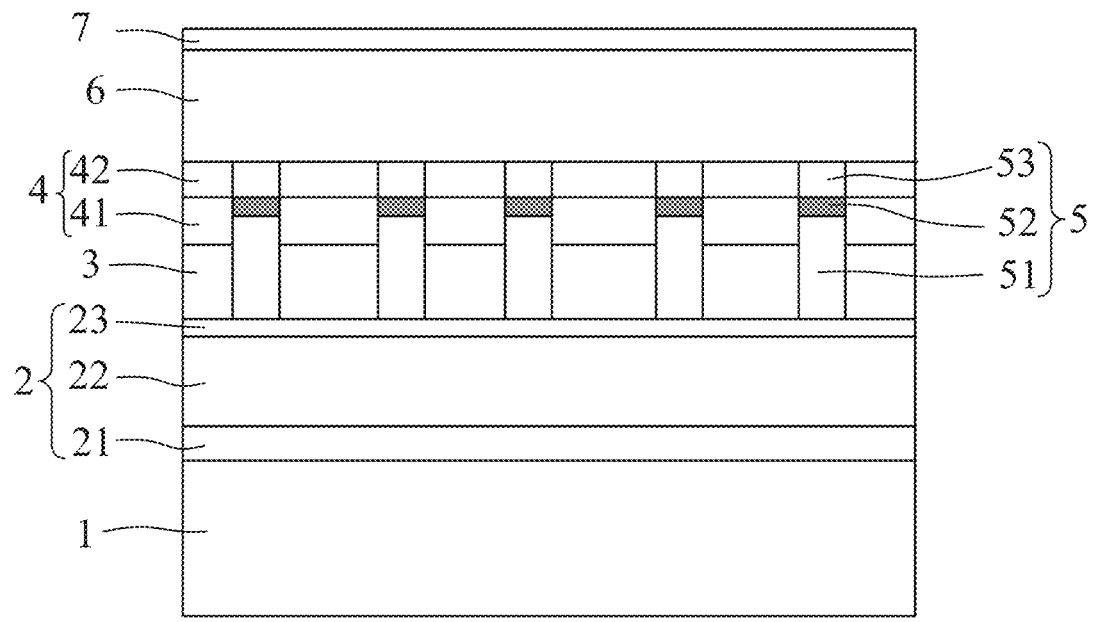

Referring to FIG. 5, the second epitaxial layered structure 6 is flipped over to bond to the first epitaxial layered structure 2 such that the metallic layer 52 is sandwiched between the first and second ohmic contact layers 51, 53 to form an ohmic contact. That is, the metallic layer 52 and the first and second ohmic contact layers 51, 53 cooperatively form the electrically conductive structure 5. In addition, the first and second transparent optical layers 41, 42 are combined to form the bonding unit 4. The growth substrate 11 is then removed from the second epitaxial layered structure 6 to expose the P-type ohmic contact layer 7.

Figure 6:
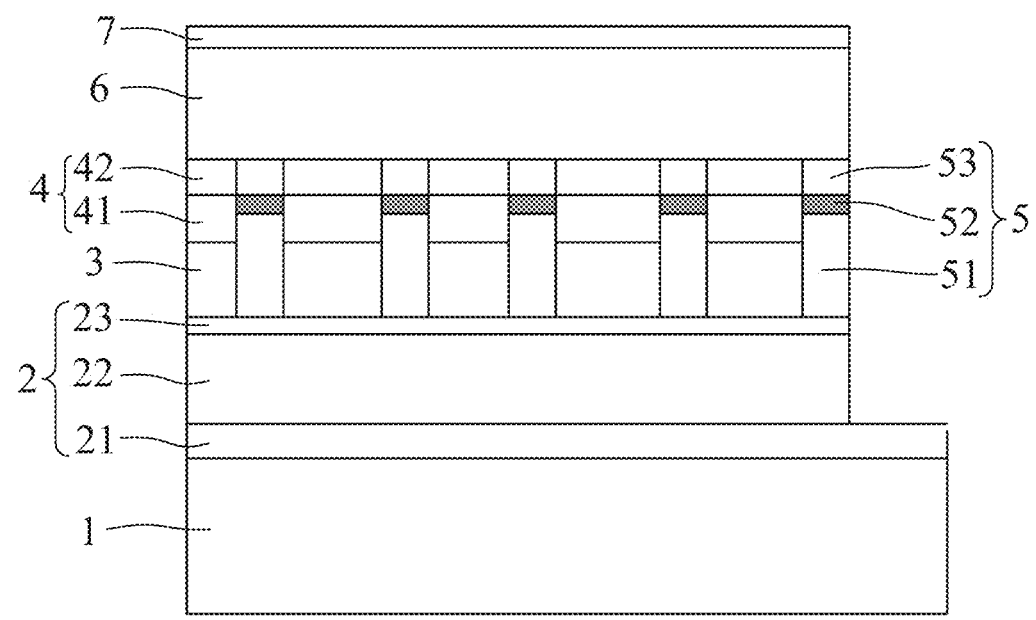

Referring to FIG. 6, the active layer 22 and the P-type semiconductor layer 23 of the first epitaxial layered structure 2, the light conversion layer 3, the bonding unit 4, the electrically conductive structure 5, the second epitaxial layered structure 6, and the N-type ohmic contact layer 7 are subjected to the photolithography process until a portion of the N-type semiconductor layer 21 of the first epitaxial layered structure 2 is exposed.

Figure 7:
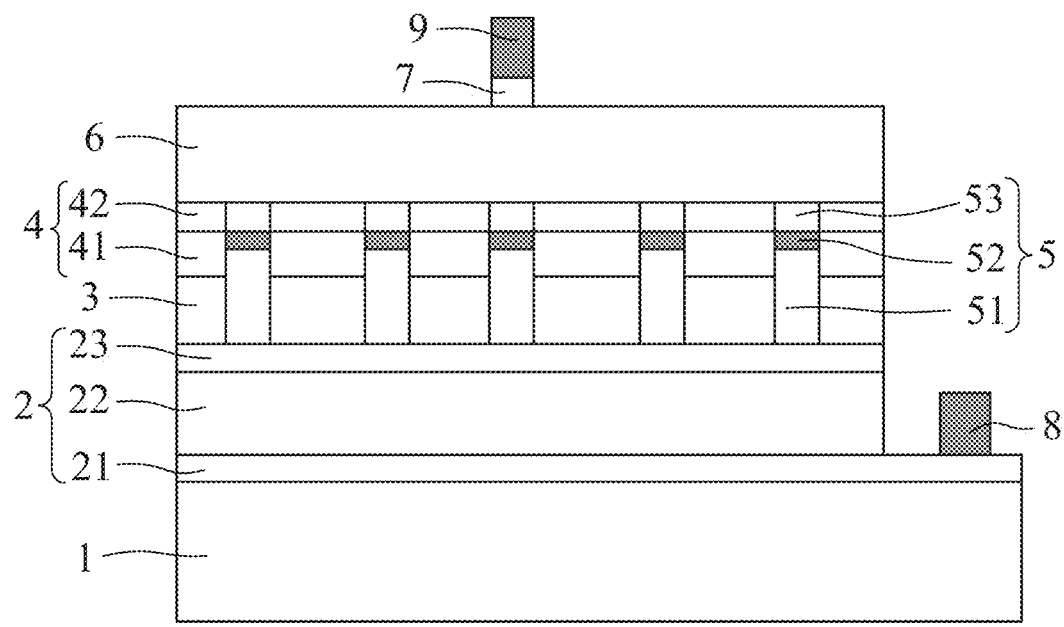

Referring to FIG. 7, the N-type ohmic contact layer 7 is subjected to the photolithography process to remove a portion of the N-type ohmic contact layer 7 and to expose the second epitaxial layered structure 6, and then an N-type electrode 8 and a P-type electrode 9 are formed on the exposed region of the N-type semiconductor layer 21 and on the remainder of the P-type ohmic contact layer 7, respectively.

Finally, the reflective mirror layer 10 is formed on the growth substrate 1 opposite to the first epitaxial layered structure 2 to obtain the first embodiment of the LED device as shown in FIG. 1.

Figure 8:
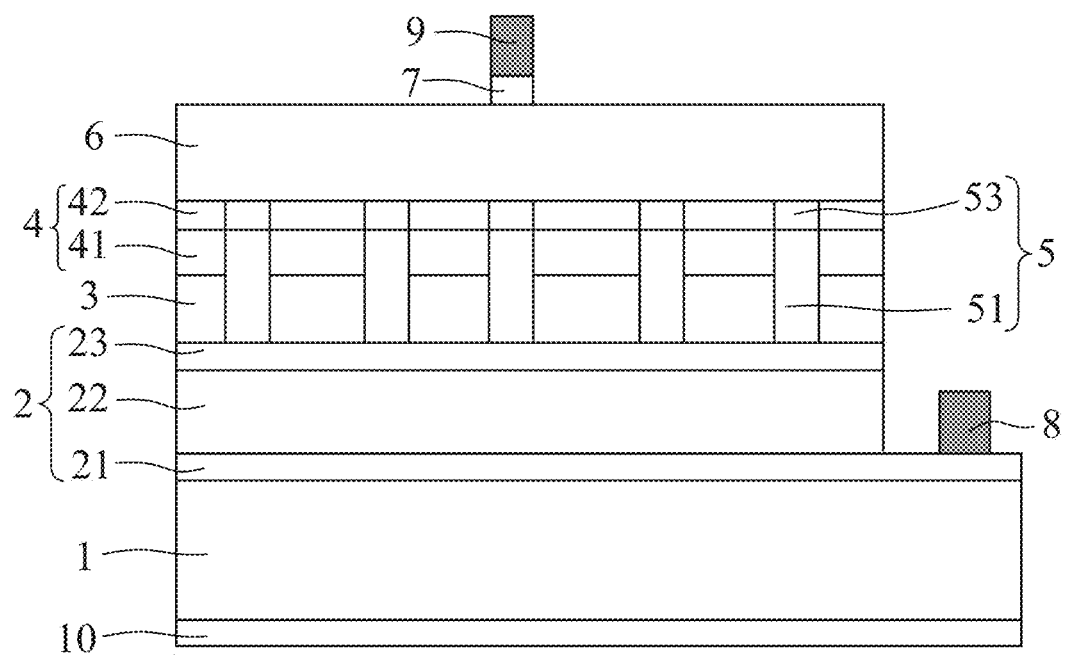
FIG. 8 is a schematic view illustrating a second embodiment of the LED device according to the disclosure.

Referring to FIG. 8, a second embodiment of the LED device according to the disclosure is generally similar to the first embodiment of the LED device, except that the electrically conductive structure 5 of the second embodiment does not include the metallic layer 52. The first ohmic contact layer 51 and the second ohmic contact layer 52 of the electrically conductive structure 5 are heavily doped to form an electrical connection therebetween. As such, the LED device may be manufactured in a more simplified manner, and a manufacturing cost thereof may be greatly reduced.

Figure 9:
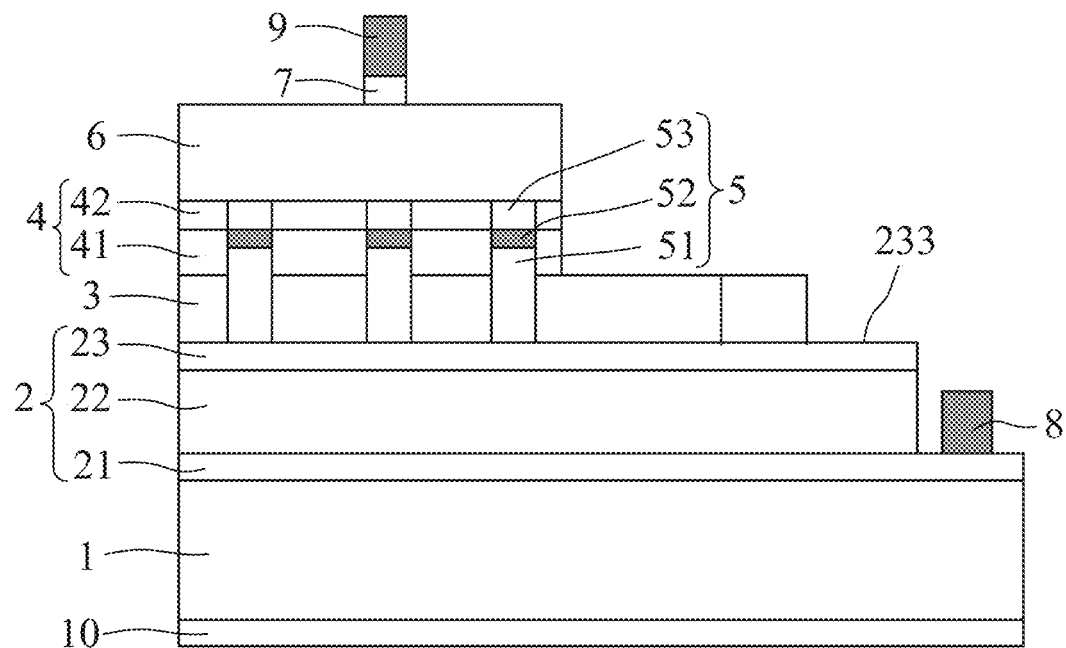
FIG. 9 is a schematic view illustrating a third embodiment of the LED device according to the disclosure.
Figure 10:
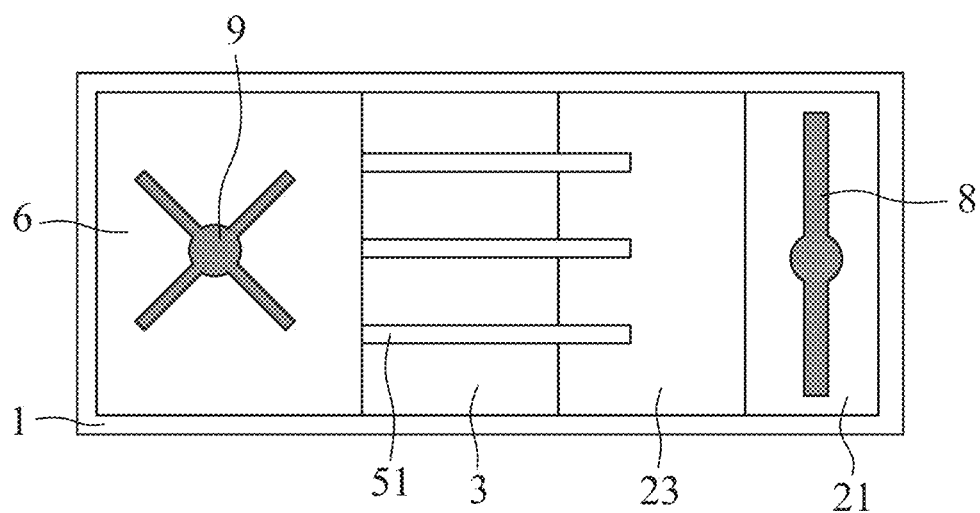
FIG. 10 is a schematic top view of the third embodiment.

Referring to FIGS. 9 and 10, a third embodiment of the LED device according to the disclosure is generally similar to the first embodiment, except for the following differences.

In the third embodiment, the upper surface of the P-type semiconductor layer 23 of the first epitaxial layered structure 2 further has a third region 233 that is different from the first and second regions 231, 232, and that is exposed from the light conversion layer 3 and the electrically conductive structure 5. The bonding unit 4 is formed on a portion of the light conversion layer 3 such that the remainder of the light conversion layer 3 is exposed from the bonding unit 4. In other words, the upper surface of the first epitaxial layered structure 2 is not smaller in size than a projection of an outline of the light conversion layer 3 on the first epitaxial layered structure 2, and a projection of the outline of the light conversion layer 3 on the first epitaxial layered structure 2 is not smaller in size than a projection of an outline of the bonding unit 4 on the first epitaxial layered structure 2.

In addition, the light conversion layer 3 includes a green phosphor which is capable of being excited by the blue light emitted from the first epitaxial layered structure 2 to emit green light (i.e., light of the third wavelength range). As such, the blue light from the third region 233 of the first epitaxial layered structure 2, the green light from the remainder of the light conversion layer 3, and the red light from the second epitaxial layered structure 2 are mixed to form white light.

A fourth embodiment of the LED device according to the disclosure is generally similar to the first embodiment, except that the light conversion layer 3 of the fourth embodiment includes a green phosphor, which is capable of being excited by the blue light emitted from the first epitaxial layered structure 2 to emit green light (i.e., light of the third wavelength range). As such, light of the first wavelength range is blue light, light of the second wavelength range is red light, and light of the third wavelength range is the green light that is emitted from the light conversion layer 3, and that is allowed to pass through the bonding unit 4 to mix with the red light emitted from the second epitaxial layered structure 6 so as to form yellow light.

It should be noted that, an area of the bonding unit 4 (i.e., a size of the projection of the outline of the bonding unit 4 on the first epitaxial layered structure 2) may be adjusted according to a desired light intensity of the green light to be emitted from the light conversion layer 3, thereby controlling the light intensity of the resulting yellow light. Conventional LEDs that emit yellow light are usually made of an AlGaInP-based material. However, the contents of the AlGaInP-based material are relatively difficult to be precisely controlled, which may result in an emitted light deviating from the desired yellow color. By controlling an amount of the green light that passes through the bonding unit 4, the LED device of this disclosure is capable of emitting a stable yellow light.

In sum, by formation of the light conversion layer 3 and the bonding unit 4 between the first and second epitaxial layered structure 2, 6 that emit light with different wavelength ranges, the LED device of the disclosure is capable of emitting light having a desired color and an enhanced luminance. As such, a light extraction efficiency of the LED device may be increased as compared to that of the conventional LED devices under the same amount of electric current. In addition, the method for manufacturing the LED device of the disclosure is relatively simple, which does not require formation of a double- or multiple-junction structure, and therefore a manufacturing cost thereof may be reduced.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A light-emitting diode device, comprising:
   a first epitaxial layered structure which emits light of a first wavelength range, and which has an upper surface having a first region and a second region different from said first region;
   a second epitaxial layered structure which emits light of a second wavelength range different from the first wavelength range, which is spaced-apart disposed on said upper surface of said first epitaxial layered structure, and which has a band gap smaller than that of said first epitaxial layered structure;
   a light conversion layer that is formed on said first region of said upper surface of said first epitaxial layered structure and that is configured to be excited by light of the first wavelength range emitted from the first epitaxial layered structure to emit light of a third wavelength range different from the first wavelength range;
   a bonding unit that is disposed on said light conversion layer and that is configured to allow light of the third wavelength range emitted from said light conversion layer to pass therethrough and, said bonding unit and said light conversion layer interconnecting said first and second epitaxial layered structures; and
   an electrically conductive structure that is formed on said second region of said upper surface of said first epitaxial layered structure and that electrically connects said first epitaxial layered structure to said second epitaxial layered structures;
   wherein said bonding unit is configured to selectively allow light having a wavelength that falls within the third wavelength range to pass therethrough, and to filter out light having a wavelength that falls outside the third wavelength range, and
   wherein light of the third wavelength range emitted from said light conversion layer has a peak wavelength that is substantially equal to a peak wavelength of light of the second wavelength range emitted from said second epitaxial layered structure.

2. The light-emitting diode device according to claim 1, wherein said light conversion layer has a thickness ranging from 0.5 µm to 100 µm.

3. The light-emitting diode device according to claim 1, wherein said light conversion layer includes red phosphor, and wherein light of the second wavelength range is red light, and light of the third wavelength range is red light.

4. The light-emitting diode device according to claim 1, wherein said bonding unit includes a plurality of light-transmissive films stacked on one another.

5. The light-emitting diode device according to claim 1, wherein said bonding unit is made of a band-pass material.

6. The light-emitting diode device according to claim 1, wherein said bonding unit includes a first transparent optical layer disposed on said first epitaxial layered structure, and a second transparent optical layer disposed between said first transparent optical layer and said second epitaxial layered structure.

7. The light-emitting diode device according to claim 1, wherein said electrically conductive structure is immediately adjacent to said light conversion layer and penetrates said bonding unit.

8. The light-emitting diode device according to claim 1, wherein said electrically conductive structure includes a first ohmic contact layer formed on said first epitaxial layered structure and a second ohmic contact layer formed between said first epitaxial layered structure and said second epitaxial layered structure.

9. The light-emitting diode device according to claim 8, wherein said electrically conductive structure further includes a metallic layer disposed between said first ohmic contact layer and said second ohmic contact layer.

10. The light-emitting diode device according to claim 1, wherein said light conversion layer includes green phosphor, and wherein light of the first wavelength range is blue light, light of the second wavelength range is red light, and light of the third wavelength range is green light that is allowed to pass through said bonding unit to mix with the red light so as to form yellow light.

11. The light-emitting diode device according to claim 1, wherein:
    said upper surface of said first epitaxial layered structure further has a third region that is different from said first and second regions and that is exposed from said light conversion layer and said electrically conductive structure,
    said bonding unit is formed on a portion of said light conversion layer such that the remainder of said light conversion layer is exposed from said bonding unit.

12. The light-emitting diode device according to claim 11, wherein said light conversion layer includes green phosphor, and wherein light of the first wavelength range is blue light, light of the second wavelength range is red light, and light of the third wavelength range is green light, the blue light from said third region of said first epitaxial layered structure, the green light from said remainder of said light conversion layer and the red light from said second epitaxial layered structure being mixed to form white light.

13. The light-emitting diode device according to claim 1, wherein said upper surface of said first epitaxial layered structure is not smaller in size than a projection of an outline of said light conversion layer on said first epitaxial layered structure.

14. The light-emitting diode device according to claim 1, wherein a projection of an outline of said light conversion layer on said first epitaxial layered structure is not smaller in size than a projection of an outline of said bonding unit on said first epitaxial layered structure.

15. The light-emitting diode device according to claim 1, wherein said second epitaxial layered structure is invertedly disposed on said first epitaxial layered structure.

16. The light-emitting diode device according to claim 15, wherein said first epitaxial layered structure includes a first N-type semiconductor layer, a first active layer disposed on said first N-type semiconductor layer, and a first P-type semiconductor layer disposed on said first active layer, and wherein said second epitaxial layered structure includes a second P-type semiconductor layer, a second active layer, and a second N-type semiconductor layer stacked on one another in a direction away from said first epitaxial layered structure.

17. A light-emitting diode device, comprising:
    a first epitaxial layered structure which emits light of a first wavelength range, and which has an upper surface having a first region and a second region different from said first region;
    a second epitaxial layered structure which emits light of a second wavelength range different from the first wavelength range, which is spaced-apart disposed on said upper surface of said first epitaxial layered structure, and which has a band gap smaller than that of said first epitaxial layered structure;
    a light conversion layer that is formed on said first region of said upper surface of said first epitaxial layered structure and that is configured to be excited by light of the first wavelength range emitted from said first epitaxial layered structure to emit light of a third wavelength range different from the first wavelength range, said light conversion layer including green phosphor;
    a bonding unit that is disposed on said light conversion layer and that is configured to allow light of the third wavelength range emitted from said light conversion layer to pass therethrough and, said bonding unit and said light conversion layer interconnecting said first and second epitaxial layered structures; and
    an electrically conductive structure that is formed on said second region of said upper surface of said first epitaxial layered structure and that electrically connects said first epitaxial layered structure to said second epitaxial layered structure,
    wherein light of the first wavelength range is blue light, light of the second wavelength range is red light, and light of the third wavelength range is green light that is allowed to pass through said bonding unit to mix with the red light so as to form yellow light.

18. A light-emitting diode device, comprising:
    a first epitaxial layered structure which emits light of a first wavelength range, and which has an upper surface having a first region and a second region different from said first region;
    a second epitaxial layered structure which emits light of a second wavelength range different from the first wavelength range, which is spaced-apart disposed on said upper surface of said first epitaxial layered structure, and which has a band gap smaller than that of said first epitaxial layered structure;
    a light conversion layer that is formed on said first region of said upper surface of said first epitaxial layered structure and that is configured to be excited by light of the first wavelength range emitted from the first epitaxial layered structure to emit light of a third wavelength range different from the first wavelength range;
    a bonding unit that is disposed on said light conversion layer and that is configured to allow light of the third wavelength range emitted from said light conversion layer to pass therethrough and, said bonding unit and said light conversion layer interconnecting said first and second epitaxial layered structures; and
    an electrically conductive structure that is formed on said second region of said upper surface of said first epitaxial layered structure and that electrically connects said first epitaxial layered structure to said second epitaxial layered structure,
    wherein said upper surface of said first epitaxial layered structure further has a third region that is different from said first and second regions and that is exposed from said light conversion layer and said electrically conductive structure, and said bonding unit is formed on a portion of said light conversion layer such that the remainder of said light conversion layer is exposed from said bonding unit.

19. The light-emitting diode device according to claim 18, wherein said light conversion layer includes green phosphor, and wherein light of the first wavelength range is blue light, light of the second wavelength range is red light, and light of the third wavelength range is green light, the blue light from said third region of said first epitaxial layered structure, the green light from said remainder of said light conversion layer and the red light from said second epitaxial layered structure being mixed to form white light.

\* \* \* \* \*